(12) United States Patent
Chen et al.

(10) Patent No.: US 8,969,115 B2
(45) Date of Patent: *Mar. 3, 2015

(54) TRANSPARENT CONDUCTIVE ELECTRODE STACK CONTAINING CARBON-CONTAINING MATERIAL

(71) Applicant: International Business Machines Corporation, Armonk, NY (US)

(72) Inventors: Tze-Chiang Chen, Yorktown Heights, NY (US); James B. Hannon, Lake Lincolndale, NY (US); Ning Li, White Plains, NY (US); Satoshi Oida, Yorktown Heights, NY (US); George S. Tulevski, White Plains, NY (US); Devendra K. Sadana, Pleasantville, NY (US)

(73) Assignee: International Business Machines Corporation, Armonk, NY (US)

(*) Notice: Subject to any disclaimer, the term of this patent is extended or adjusted under 35 U.S.C. 154(b) by 0 days.

This patent is subject to a terminal disclaimer.

(21) Appl. No.: 14/170,708

(22) Filed: Feb. 3, 2014

(65) Prior Publication Data
US 2014/0179045 A1    Jun. 26, 2014

Related U.S. Application Data

(63) Continuation of application No. 13/660,604, filed on Oct. 25, 2012, now Pat. No. 8,741,678, which is a continuation-in-part of application No. 13/626,418, filed on Sep. 25, 2012, now abandoned.

(51) Int. Cl.
*H01L 21/00* (2006.01)
*H01L 51/52* (2006.01)
(Continued)

(52) U.S. Cl.
CPC .............. *H01L 51/5221* (2013.01); *B32B 9/04* (2013.01); *B32B 15/00* (2013.01); *B32B 27/06* (2013.01);
(Continued)

(58) Field of Classification Search
USPC ....................................... 438/34, 29
See application file for complete search history.

(56) References Cited

U.S. PATENT DOCUMENTS 7,785,165 B2 * 8/2010 Wei et al. .......................... 445/51
8,741,678 B2 * 6/2014 Chen et al. ....................... 438/34
(Continued)

FOREIGN PATENT DOCUMENTS

WO    WO2011139236 A1    11/2011

OTHER PUBLICATIONS

Han, T.-H., et al., "Extremely efficient flexible organic light-emitting diodes with modified graphene anode" Nature Photonics, Jan. 10, 2012, 6, 105-110.
(Continued)

*Primary Examiner* — Reema Patel
(74) *Attorney, Agent, or Firm* — Scully, Scott, Murphy & Presser, P.C.; Louis J. Percello, Esq.

(57) ABSTRACT

A transparent conductive electrode stack containing a work function adjusted carbon-containing material is provided. Specifically, the transparent conductive electrode stack includes a layer of a carbon-containing material and a layer of a work function modifying material. The presence of the work function modifying material in the transparent conductive electrode stack shifts the work function of the layer of carbon-containing material to a higher value for better hole injection into the OLED device as compared to a transparent conductive electrode that includes only a layer of carbon-containing material and no work function modifying material.

14 Claims, 3 Drawing Sheets

(51) Int. Cl.
  *B32B 9/04* (2006.01)
  *B32B 15/00* (2006.01)
  *B32B 27/06* (2006.01)
  *H01L 51/50* (2006.01)
  *B82Y 30/00* (2011.01)

(52) U.S. Cl.
  CPC ........ *H01L 51/5088* (2013.01); *H01L 51/5206* (2013.01); *H01L 51/5215* (2013.01); *B82Y 30/00* (2013.01)
  USPC ...................................... 438/34; 257/E21.09

(56) References Cited

U.S. PATENT DOCUMENTS

| | | | |
|---|---|---|---|
| 2007/0134510 A1 | 6/2007 | Vestwebber et al. | |
| 2011/0127497 A1 | 6/2011 | Choi et al. | |
| 2011/0244662 A1 | 10/2011 | Lee et al. | |
| 2011/0303899 A1 | 12/2011 | Padhi et al. | |
| 2012/0052308 A1 | 3/2012 | El-Ashry et al. | |
| 2014/0084253 A1* | 3/2014 | Chen et al. | 257/40 |
| 2014/0087500 A1* | 3/2014 | Chen et al. | 438/29 |

OTHER PUBLICATIONS

Wit, J., et al., "Organic Light-Emitting Diodes on Solution-Processed Graphene Transparent Electrodes," ACS Nano, Nov. 10, 2009, vol. 4 No. 1, 43-48.

Sun, T. et al., "Multilayered graphene used as anode of organic light emitting devices," Applied Physics Letters, Mar. 29, 2010, 96, 133301.

Chandra, B. et al., "Stable Charge-Transfer Doping of Transparent Single-Walled Carbon Nanotube Films," Chem. Mater., Sep. 1, 2010, 22, 5179-5183.

Yu, Z., et al., "Fully bendable polymer light emitting devices with carbon nanotubes as cathode and anode," Applied Physics Letters, Nov. 19, 2009, 95, 203304.

Chien, Y.-M., et al., "A solution processed top emission OLED with transparent carbon nanotube electrodes," Nanotechnology, Mar. 8, 2010 21, 134020.

Park, H. et al., "Organic Solar Cells with Graphene Electrodes and Vapor Printed Poly(3,4-ethylenedioxythiophene) as the Hole Transporting Layers," ACS Nano, Jun. 22, 2012, 6 (7), pp. 6370-6377.

* cited by examiner

TRANSPARENT CONDUCTIVE ELECTRODE STACK CONTAINING CARBON-CONTAINING MATERIAL

CROSS REFERENCE TO RELATED APPLICATION

This application is a continuation of U.S. patent application Ser. No. 13/660,604, filed Oct. 25, 2012, now U.S. Pat. No. 8,741,678 issued on Jun. 3, 2014, which is a continuation of U.S. patent application Ser. No. 13/626,418, filed Sep. 25, 2012, now abandoned, the entire content and disclosure of each is incorporated herein by reference.

BACKGROUND

The present disclosure relates to a transparent conductive electrode and a method of forming the same. More particularly, the present disclosure relates to a transparent conductive electrode stack which includes at least a layer of a carbon-containing material, an organic light emitting diode (OLED) device that includes the transparent conductive electrode stack, and methods of forming the transparent conductive electrode stack and the OLED device containing the same.

Organic light emitting diode device technology is emerging as a leading technology for displays and lighting. OLED displays posses key advantages including vibrant color, high contrast ratios, wide viewing angles and are flexible over conventional liquid crystal displays (LCDs). Moreover, OLED lighting is much more efficient than incandescent bulbs and has similar efficiency as the nitride based light emitting diodes (LEDs).

A typical OLED comprises a substrate which is usually made of glass or a similar transparent material. An anode layer is positioned on the substrate. The anode layer can be made of a material having a relatively high work function and is substantially transparent for visible light. A typical material for the anode layer is indium tin oxide (ITO). A layer of electroluminescent material is positioned on the anode layer, serving as the emitting layer of the OLED. Common materials for forming the emitting layer are polymers such as, for example, poly(p-phenylenvinylene) (PPV) and molecules like tris(8-oxychinolinato)aluminum ($Alq_3$). In the case of molecules, the emitting layer typically comprises several layers of the molecules. A cathode layer of material having a lower work function like aluminum (Al), calcium (Ca) or magnesium (Mg) is positioned on the emitting layer. During operation of the OLED, the cathode layer and the anode layer are connected to a power supply.

The basic principles of electroluminescence and, thus, of the OLED are the following: The anode layer and the cathode layer inject charge carriers, i.e., electrons and holes, into the emitting layer. In the emitting layer, the charge carriers are transported and the charge carriers of opposite charge form so called excitons, i.e., excited states. The excitons decay radiatively into the ground state by generating light. The generated light is then emitted by the OLED through the anode layer which is made of transparent material like ITO. The color of the generated light depends on the material used for the organic emitting layer.

SUMMARY

A transparent conductive electrode stack containing a work function adjusted carbon-containing material is provided. Specifically, a transparent conductive electrode stack is provided that includes, in any order, a layer of a carbon-containing material and a layer of a work function modifying material. The presence of the work function modifying material in the transparent conductive electrode stack of the present disclosure shifts the work function of the layer of carbon-containing material to a higher value for better hole injection into the OLED device as compared to a transparent conductive electrode that includes only a layer of carbon-containing material and no work function modifying material.

In one aspect of the present disclosure, a transparent conductive electrode stack is provided. In this aspect of the present disclosure, the transparent conductive electrode stack includes a layer of a carbon-containing material; and a layer of a work function modifying material located on an exposed surface of the layer of carbon-containing material.

In another aspect of the present disclosure, an organic light emitting diode (OLED) device is provided. In this aspect of the present disclosure, the OLED device includes a substrate; a transparent conductive electrode stack located on an exposed surface of the substrate; a layer of electroluminescent material located above the transparent conductive electrode stack; and a layer of a cathode material located on an exposed surface of the layer of electroluminescent material. In accordance with the present disclosure, the transparent conductive electrode stack includes a layer of a carbon-containing material, and a layer of a work function modifying material located on an exposed surface of the layer of carbon-containing material.

In a further aspect of the present disclosure, a method of forming a transparent conductive electrode stack is provided. The method of forming the transparent conductive electrode stack includes providing a layer of a carbon-containing material; and forming a layer of a work function modifying material on an exposed surface of the layer of carbon-containing material.

In yet another aspect of the present disclosure, a method of forming an organic light emitting diode (OLED) device is provided. The method of forming the OLED device includes providing a substrate; forming a transparent conductive electrode stack on an exposed surface of the substrate, wherein the transparent electrode stack comprises a layer of a carbon-containing material and a layer of a work function modifying material on an exposed surface of the layer of carbon-containing material; forming a layer of electroluminescent material on an exposed surface of the transparent conductive electrode stack; and forming a layer of a cathode material on an exposed surface of the layer of electroluminescent material.

DETAILED DESCRIPTION

Figure 1:
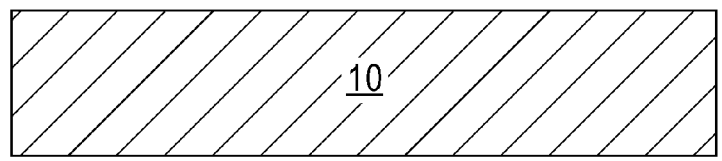
FIG. 1 is a pictorial representation (through a cross sectional view) illustrating a substrate that can be employed in one embodiment of the present disclosure.

The present disclosure, which provides a transparent conductive electrode stack which includes at least a layer of a carbon-containing material, an organic light emitting diode (OLED) device that includes the transparent conductive electrode stack, and methods of forming the transparent conductive electrode stack and the OLED device containing the same, will now be described in greater detail by referring to the following discussion and drawings that accompany the present application.

It is noted that the drawings of the present application are provided for illustrative purposes and, as such, they are not drawn to scale. In the drawings and the description that follows, like materials are referred to by like reference numerals. For purposes of the description hereinafter, the terms "upper", "lower", "right", "left", "vertical", "horizontal", "top", "bottom", and derivatives thereof shall relate to the components, layers and/or materials as oriented in the drawing figures which accompany the present application.

In the following description, numerous specific details are set forth, such as particular structures, components, materials, dimensions, processing steps and techniques, in order to provide a thorough understanding of the present disclosure. However, it will be appreciated by one of ordinary skill in the art that the present disclosure may be practiced with viable alternative process options without these specific details. In other instances, well-known structures or processing steps have not been described in detail in order to avoid obscuring the various embodiments of the present disclosure.

In current OLED displays and lighting technologies, indium tin oxide transparent conductive electrodes are used as an anode. Such an OLED configuration has the following disadvantages. Transparent conductive electrodes containing indium tin oxide contain the rare earth metal indium which is an expensive material thus increasing the cost of manufacturing indium tin oxide-containing OLED devices. Indium tin oxide-containing OLED devices easily fail after bending and are thus not suitable for flexible applications. Also, indium tin oxide is toxic and alternative materials for transparent conductive electrodes are thus needed.

In the present disclosure, the drawbacks mentioned above with respect to conventional indium tin oxide transparent conductive electrodes have been obviated by providing a transparent conductive electrode stack containing a work function adjusted carbon-containing material. Specifically, a transparent conductive electrode stack is provided that includes a layer of carbon-containing material and a layer of a work function modifying material. The presence of the work function modifying material in the transparent conductive electrode stack of the present disclosure shifts the work function of the layer of carbon-containing material to a higher value for better hole injection into the OLED device as compared to a transparent conductive electrode that includes only a layer of carbon-containing material and no work function modifying material.

Although the following description illustrates the transparent conductive electrode stack of the present disclosure as a component of an OLED device, the transparent conductive electrode stack of the present disclosure is not limited to being used in only such a device. Instead, the transparent conductive electrode stack of the present disclosure can be used in other types of devices such as, for example, photovoltaic devices, solar cells, flat panel displays or touch screens.

Also, and although the present disclosure illustrates and describes that the transparent conductive electrode stack contains a bottom carbon-containing layer and an upper layer(s) of work function modifying material(s), the present disclosure is not limited to only such an embodiment. Instead, and in some embodiments of the present disclosure, particularly when the work function modifying material is comprised of a metal or an array of metal dots, the layer of work function modifying material can be located beneath the layer of carbon-containing material.

Referring to FIG. 1, there is illustrated a substrate 10 that can be employed in one embodiment of the present disclosure. The substrate 10 that can be employed in the present disclosure may be rigid or flexible and may include, for example, a semiconductor material, glass, a ceramic, tape, or a plastic. Typically, the substrate 10 that is employed in the present disclosure is a transparent substrate. In one embodiment of the present disclosure, the substrate 10 is transparent and is comprised of glass. In another embodiment of the present disclosure, the substrate 10 is transparent and is comprised of a plastic. The substrate 10 that is employed in the present disclosure may have a thickness from a few hundred microns to a few millimeters. In another embodiment, the substrate 10 that is employed may have a thickness from a few tens of microns to a few millimeters. The substrate 10 can have other thicknesses that are above and/or below the ranges mentioned above.

Figure 2:
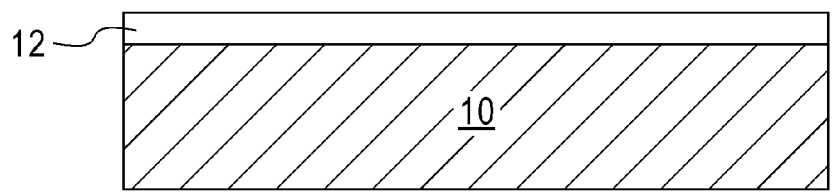
FIG. 2 is a pictorial representation (through a cross sectional view) illustrating the substrate of FIG. 1 after forming a layer of a carbon-containing material on an exposed surface of the substrate.

Referring to FIG. 2, there is illustrated the substrate 10 after forming a layer of a carbon-containing material 12 on an exposed surface of the substrate 10. In some embodiments, and as illustrated in the drawings of the present disclosure, the layer of carbon-containing material 12 serves as a transparent bottom electrode of an OLED device. In other embodiments, the layer of carbon-containing material 12 can serve as a top electrode of the OLED device. In yet another embodiment, the layer of carbon-containing material 12 can serve as an electrode of other types of devices such as, for example, photovoltaic devices, solar cells, flat panel displays, or touch screen devices.

In one embodiment of the present disclosure, the layer of carbon-containing material 12 comprises a layer of graphene. The term "graphene" as used throughout the present disclosure denotes a one-atom-thick planar sheet of $sp^2$-bonded carbon atoms that are densely packed in a honeycomb crystal lattice. The graphene employed in the present disclosure has a two-dimensional (2D) hexagonal crystallographic bonding structure.

In another embodiment of the present disclosure, the layer of carbon-containing material 12 comprises a carbon nanotube. The term "carbon nanotube" as used throughout the present disclosure denotes allotropes of carbon with a cylindrical nanostructure. The carbon nanotubes can be single walled-nanotubes (SWNTs) or multi-walled nanotubes (MWNTs).

In embodiments in which the carbon-containing material 12 is a layer of graphene, the layer of graphene can be provided in the present disclosure by first depositing a blanket layer of graphene onto a handle substrate. The handle substrate is typically comprised of a material which can catalyze the formation of graphene on a surface thereof. For example and in some embodiments of the present disclosure, the handle substrate may comprise copper or a copper foil.

The handle substrate can be formed utilizing any deposition process well known to those skilled in the art. For example, a handle substrate comprised of copper can be formed by chemical vapor deposition, plasma enhanced chemical vapor deposition, physical vapor deposition, sputtering, plating, chemical solution deposition or electroless plating. Typically, copper foils are formed by sputtering a copper foil from a copper-containing target.

In one embodiment, the handle substrate has a thickness from 7 μm to 25 μm. In another embodiment, the handle substrate has a thickness from 20 μm to 30 μm. Other thicknesses for the handle substrate that are above and/or below the thickness ranges mentioned above can also be used in the present disclosure.

The blanket layer of graphene that can be used in the present disclosure is a contiguous layer of graphene that can be comprised of single-layer graphene (nominally 0.34 nm thick), few-layer graphene (2-10 graphene layers), multi-layer graphene (>10 graphene layers), a mixture of single-layer, few-layer, and multi-layer graphene, or any combination of graphene layers mixed with amorphous and/or disordered carbon phases that result by graphene formation at lower temperatures (between 200° C. and 900° C.). Typically, a single layer of graphene is used in the present disclosure.

The blanket layer of graphene can be formed utilizing a deposition process such as, for example, chemical vapor deposition (CVD), plasma enhanced chemical vapor deposition (PECVD), and ultraviolet (UV) assisted CVD. In one embodiment, the blanket layer of graphene is formed by CVD. In some embodiments, the deposition process that can be employed in the present disclosure in forming the blanket layer of graphene is initiated on the exposed surface of the handle substrate.

In one embodiment, the deposition of the blanket layer of graphene on the exposed surface of the handle substrate can be performed at a temperature up to, but not exceeding, 500° C. for PECVD. In another embodiment, the depositing (i.e., growth) of graphene occurs at a temperature from 800° C. to 1080° C. The deposition process that can be used in the present disclosure for forming the blanket layer of graphene includes utilizing any known carbon sources including, for example, benzene, propane, ethane and other hydrocarbons, and other carbon-containing gases.

In one embodiment of the present disclosure, the blanket layer of graphene can have a thickness from 0.34 nm to 0.8 nm. In another embodiment, the blanket layer of graphene can have a thickness from 0.7 nm to 3.4 nm. The blanket layer of graphene can have other thicknesses that are above the ranges mentioned above.

After depositing the blanket layer of graphene on the handle substrate, the blanket layer of graphene can be transferred to substrate 10 utilizing a bonding process. Bonding can be achieved at room temperature, up to about 300° C. Following bonding, the handle substrate can be removed by etching, planarization or grinding.

The blanket layer of graphene that is transferred to substrate 10 and is used as carbon-containing material 12 has a work function that about 4.5 eV. Such a work function is below the Fermi level of most electroluminescent material and therefore poor carrier injection and poor efficiency are obtained when OLED devices including only graphene as the transparent conductive electrode are employed. Also, the blanket layer of graphene that is transferred to substrate 10 has a sheet resistance of about 1800 ohms/square.

When the carbon-containing material 12 is a carbon nanotube, a carbon nanotube film can be formed directly on the surface of substrate 10 utilizing conventional techniques that are well known to those skilled in the art. For example, a carbon nanotube film can be formed by arc discharge, laser ablation, and chemical vapor deposition (CVD). These techniques typically take place in vacuum or with process gases. CVD growth of CNTs can occur in vacuum or at atmospheric pressure.

In one embodiment of the present disclosure, the carbon nanotube film can have a thickness from 20 nm to 100 nm. In another embodiment, the carbon nanotube film can have a thickness from 30 nm to 50 nm. The carbon nanotube film can have other thicknesses that are above and/or below the ranges mentioned above.

The carbon nanotube film which can be used as carbon-containing material 12 has a work function that is about 5 eV. Such a work function is below the Fermi level of most electroluminescent material and therefore poor carrier injection and poor efficiency are obtained when OLED devices including only carbon nanotubes (CNTs) as the transparent conductive electrode are employed. Also, the carbon nanotube film has a sheet resistance of about 100 ohms/square and can be improved with the more optimized process.

Figure 3:
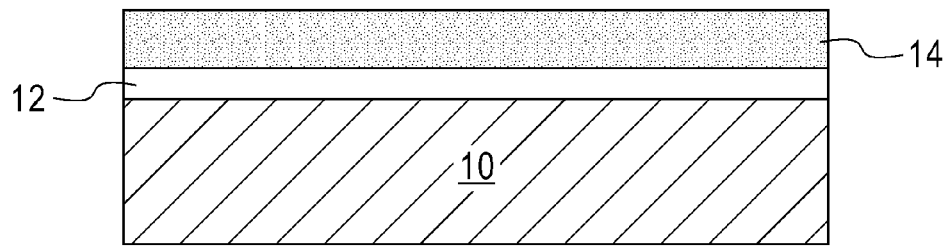
FIG. 3 is a pictorial representation (through a cross sectional view) illustrating the structure of FIG. 2 after forming a layer of a work function modifying material on an exposed surface of the layer of carbon-containing material.

Referring now to FIG. 3, there is illustrated the structure of FIG. 2 after forming a layer of a work function modifying material 14 on an exposed surface of the layer of carbon-containing material 12. The combination of the layer of carbon-containing material 12 and the layer of work function modifying material 14 provides a transparent conductive electrode stack of the present disclosure. The presence of the layer of work function modifying material 14 within the transparent conductive electrode stack of the present disclosure increases the work function of the layer of carbon-containing material 12 and serves as a p-type dopant for the layer of carbon-containing material 12.

Specifically, the layer of work function modifying material 14 within the transparent conductive electrode stack of the present disclosure increases the work function of the layer of carbon-containing material 12 such that the work function of the layer of carbon-containing material 12 'substantially' matches the Fermi level of the layer of electroluminescent material to be subsequently formed atop the transparent conductive electrode stack (i.e., elements 12 and 14). By "substantially matches" it is meant the layer of carbon-containing material 12 when used in conjunction with the layer of work function modifying material 14 has a work function that is within less than 0.7 eV from the Fermi level of the layer of electroluminescent material. As such, better hole injection into the layer of electroluminescent material is provided by employing the transparent conductive electrode stack of the present disclosure.

Also, the layer of work function modifying material 14 within the transparent conductive electrode stack of the present disclosure increases the conductivity of the layer of carbon-containing material 12 without losing transmittance.

In one embodiment of the present disclosure, the layer of work function modifying material 14 that can be employed in the present disclosure may be a single layered structure. In another embodiment of the present disclosure, the layer of work function modifying material 14 that can be employed in the present disclosure may be a multilayered structure comprising at least two distinct layers of work function modifying materials.

The work function modifying material 14 that can be employed in the present disclosure can be a metal oxide, a conductive polymer, a metal, an array of metal dots, or any combination thereof including, for example, a multilayered structure including a metal oxide and a conductive polymer.

Some specific examples of various transparent conductive electrode stacks of the present disclosure are illustrated in FIGS. 4A-4E. While these specific embodiments are shown and described, the transparent conductive electrode stack of the present disclosure is not limited to those shown in FIGS. 4A-4E.

Figure 4A:
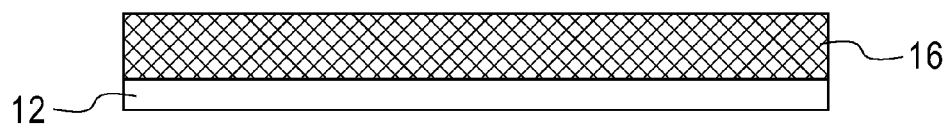
FIG. 4A is a pictorial representation (through a cross sectional view) illustrating an embodiment of the present disclosure in which the transparent conductive electrode stack includes a layer of a carbon-containing material, and a layer of a metal oxide.
Figure 4B:
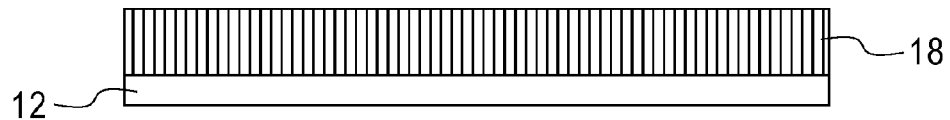
FIG. 4B is a pictorial representation (through a cross sectional view) illustrating an embodiment of the present disclosure in which the transparent conductive electrode stack includes a layer of a carbon-containing material, and a layer of a conductive polymer.
Figure 4C:
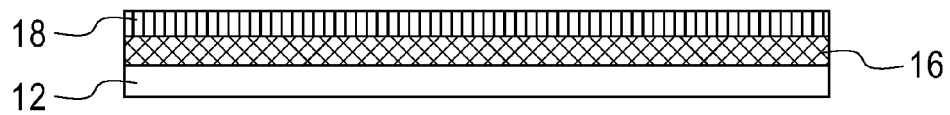
FIG. 4C is a pictorial representation (through a cross sectional view) illustrating an embodiment of the present disclosure in which the transparent conductive electrode stack includes a layer of a carbon-containing material, a layer of a conductive polymer and a layer of a metal oxide.
Figure 4D:
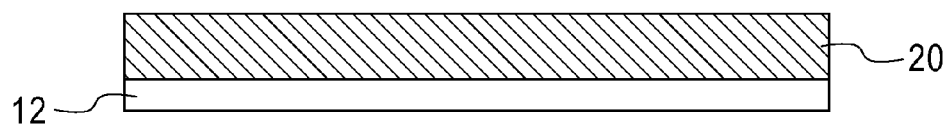
FIG. 4D is a pictorial representation (through a cross sectional view) illustrating an embodiment of the present disclosure in which the transparent conductive electrode stack includes a carbon-containing material, and a layer of a metal.
Figure 4E:
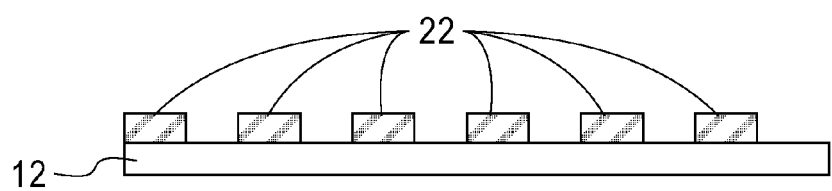
FIG. 4E is a pictorial representation (through a cross sectional view) illustrating an embodiment of the present disclosure in which the transparent conductive electrode stack includes a layer of a carbon-containing material, and an array of metal dots.

Specifically, FIG. 4A illustrates an embodiment of the present disclosure in which the transparent conductive electrode stack includes a layer of carbon-containing material 12 and a layer of a metal oxide 16. FIG. 4B illustrates an embodiment of the present disclosure in which the transparent conductive electrode stack includes a layer of a carbon-containing material 12, and a layer of a conductive polymer 18. FIG. 4C illustrates an embodiment of the present disclosure in which the transparent conductive electrode stack includes a layer of a carbon-containing material 12, a layer of a conductive polymer 18 and a layer of a metal oxide 16. FIG. 4D illustrates an embodiment of the present disclosure in which the transparent conductive electrode stack includes a carbon-containing material 12, and a layer of a metal 20, while FIG. 4E illustrates an embodiment of the present disclosure in which the transparent conductive electrode stack includes a layer of a carbon-containing material 12, and an array of metal dots 22.

In each illustrated embodiment of the present disclosure, elements 16, 18, 20 and 22 serve as the work function modifying material 14 and thus adjust the work function of the layer of carbon-containing material 12 so as to substantially match the Fermi level of the electroluminescent material.

When a metal oxide is employed as the work function modifying material 14, the metal oxide includes a metal from Groups IIIB, IVB, VB, VIB, VIIB, VIII or IIIA of the Periodic Table of Elements. Illustrated examples of metal oxides that can be employed in the present disclosure as work function modifying material 14 include, but are not limited to, $MoO_3$, $W_2O_5$, $Al_2O_3$, $V_2O_5$ and combinations or multilayers thereof. The metal oxide can be formed utilizing any well known deposition process including, for example, evaporation, chemical solution deposition, chemical vapor deposition, and sputtering.

When a conductive polymer is employed as the layer of work function modifying material 14, the conductive polymer (which can be referred to as an intrinsically conductive polymer) includes an organic polymer that conducts electricity. Examples of conductive polymers that can be employed in the present disclosure include, for example, aromatic compounds containing no heteroatoms, aromatic compounds containing a nitrogen heteroatom, aromatic compounds containing a sulfur heteroatom, polymeric compounds containing double bonds and/or aromatic compounds that also contain double bonds. In some embodiments of the present disclosure, the conductive polymers that can be employed in the present disclosure as the layer of work function modifying material 14 are selected from polyanilines and poly(3,4-ethylenedioxythiophene)poly(styrenesulfonate) or PEDOT:PSS for short.

The conductive polymer can be formed utilizing any well known deposition process including, for example, evaporation, chemical solution deposition, spin-coating, or dip coating. In some embodiments of the present disclosure, the deposition of a conductive polymer directly on an exposed surface of the layer of carbon-containing material 12 can also form a uniform contact with the layer of carbon-containing material 12.

When a metal or an array of metal dots is employed as the layer of work function modifying material 14, the metal or metal dot includes an element from Groups IIIB, IVB, VB, VIB, VIIB, VIII or IIIA of the Periodic Table of Elements. Illustrated examples of metals or metal dots include, but are not limited to, Au, Pd, Pt, W, Ag, and/or Al.

A metal film can be formed utilizing any well known deposition process including, for example, evaporation, chemical solution deposition, chemical vapor deposition, and sputtering. An array of metal dots can be formed by first depositing a metal and then patterning the same by photolithography and etching. Alternatively, an array of metal dots can be formed by deposition of a metal precursor through a mask which contains a preconfigured pattern formed therein.

In one embodiment of the present disclosure, the layer of work function modifying material 14 can have a thickness from 1 nm to 5 nm. The layer of work function modifying material 14 can have other thicknesses that are above and/or below the range mentioned above.

Figure 5:
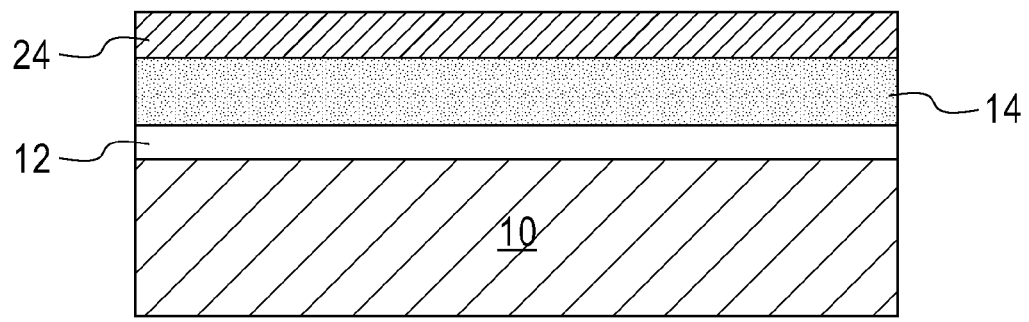
FIG. 5 is a pictorial representation (through a cross sectional view) illustrating the structure of FIG. 3 after forming a layer of an electroluminescent material on an exposed surface of the layer of work function modifying material.

Referring to FIG. 5, there is illustrated the structure of FIG. 3 after forming a layer of an electroluminescent material 24 above the transparent conductive electrode stack containing elements 12 and 14. The layer of electroluminescent material 24 that is employed in the present disclosure includes any organic material or multilayered stack of organic materials including, for example, organometallic chelates, conductive polymers, fluorescent dyes, phosphorescent dyes and conjugated dendrimers, that emits light in response to an electric current. Examples of organic materials that can be used as the electroluminescent material 24 include, but are not limited to, poly(p-phenylenvinylene) (PPV), poly(naphthalene vinylenes) (PNVs), tris(2-phenyl pyridine)iridium ($Ir(ppy)_3$), and tris(8-oxychinolinato)aluminum ($Alq_3$).

The layer of electroluminescent material 24 can be formed by conventional techniques including, for example, spin-on coating, dip coating, immersion, and chemical vapor deposition. Typically, and in one embodiment, the thickness of the layer of electroluminescent material 24 ranges from a few nm to a few hundred nm. Other thicknesses, including those above and/or below the aforementioned range can also be employed.

Figure 6:
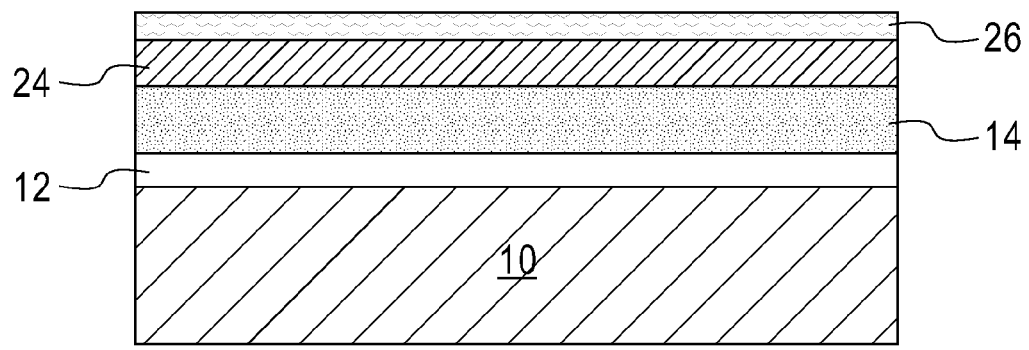
FIG. 6 is a pictorial representation (through a cross sectional view) illustrating the structure of FIG. 5 after forming a layer of a cathode material on an exposed surface of the layer of electroluminescent material.

Referring now to FIG. 6, there is illustrated the structure of FIG. 5 after formation of a layer of a cathode material 26 on an exposed surface of the layer of electroluminescent material 24. The layer of cathode material 26 can serve as an upper electrode of the OLED of the present disclosure. The layer of cathode material 26 that is employed in the present disclosure includes a material or a multilayered stack of materials having a lower work function than the transparent conductive electrode stack of the present disclosure. In one embodiment of the present disclosure, the layer of cathode material 26 can be comprised of aluminum (Al), calcium (Ca) and/or magnesium (Mg). In some embodiments, the layer of cathode material 26 may comprise a stack of LiF and Al.

The layer of cathode material 26 can be formed utilizing any deposition process including for example, thermal evaporation and sputtering. In some embodiments, the deposition process is performed through a shadow mask. Typically, and in one embodiment, the thickness of the layer of cathode material 26 ranges from 20 nm to 100 nm. Other thicknesses, including those above and/or below the aforementioned range can also be employed.

The transparent conductive electrode stack of the present disclosure which comprises a combination of the layer of carbon-containing material 12 and the layer of work function modifying material 14 is typically less toxic than a conventional ITO transparent conductive electrode. Also, transparent conductive electrode stacks comprised of the combination of the layer of carbon-containing material 12 and the layer of work function modifying material 14 are less expensive to fabricate than are their ITO counterparts. Further, transparent conductive electrode stacks comprised of the combination of the layer of carbon-containing material 12 and the layer of work function modifying material 14 are typically flexible and thus can be used in a wide variety of display and lighting applications. Furthermore, transparent conductive electrode stacks comprised of the combination of the layer of carbon-containing material 12 and the layer of work function modifying material 14 typically have a higher mechanical strength than their ITO counterpart electrodes. Moreover, the transparent conductive electrode stacks comprised of combination of the layer of carbon-containing material 12 and the layer of work function modifying material 14 are chemically stable. By "chemically stable" it is meant that the carbon-containing material 12 can endure processing steps which include a strong acid, base, and solvent, and maintain its structural integrity.

When used as a component of an OLED device, the transparent conductive electrode stacks comprised of the combination of the layer of carbon-containing material 12 and the layer of work function modifying material 14 can provide an OLED device that has electrical properties that are similar to, and in some embodiments, slightly improved as compared with, an OLED device containing a conventional ITO electrode.

In some embodiments, the transparent conductive electrode stacks comprised of the combination of the layer of carbon-containing material 12 and the layer of work function modifying material 14 can provide an OLED device that has a same or slightly higher quantum efficiency as compared to an OLED device containing a conventional ITO electrode. In some cases, the transparent conductive electrode stacks comprised of the combination of the layer of carbon-containing material 12 and the layer of work function modifying material 14 can provide an OLED device that has a same quantum efficiency as compared to an OLED device containing a conventional ITO electrode. The external quantum efficiency without any out coupling scheme is more than 20%.

While the present disclosure has been particularly shown and described with respect to preferred embodiments thereof, it will be understood by those skilled in the art that the foregoing and other changes in forms and details may be made without departing from the spirit and scope of the present disclosure. It is therefore intended that the present disclosure not be limited to the exact forms and details described and illustrated, but fall within the scope of the appended claims.

What is claimed is:

1. A method of forming an electronic device including a transparent conductive electrode stack, said method comprising:
   providing a layer of a carbon-containing material; and
   forming a layer of a work function modifying material on an exposed surface of the layer of carbon-containing material, wherein said layer of work function modifying material is a metal film or an array of metal dots, and said metal film or said array of metal dots are formed beneath the layer of carbon-containing material.

2. The method of claim 1, wherein said providing the layer of carbon-containing material comprises forming a layer of graphene on a handle substrate, transferring said layer of graphene to a substrate, and removing said handle substrate.

3. The method of claim 2, wherein said forming said layer of graphene comprises depositing said layer of graphene by chemical vapor deposition (CVD), plasma enhanced chemical vapor deposition (PECVD), or ultraviolet (UV) assisted CVD.

4. The method of claim 3, wherein said depositing comprises plasma enhanced chemical vapor deposition (PECVD) at a temperature up to, but not exceeding, 500° C.

5. The method of claim 3, wherein said depositing is performed at a temperature from 800° C. to 1080° C.

6. The method of claim 1, wherein said providing the layer of carbon-containing material comprises forming a carbon nanotube film on a substrate.

7. The method of claim 6, wherein said forming the carbon nanotube film comprises chemical vapor deposition (CVD).

8. The method of claim 1, further comprising:
   forming a layer of electroluminescent material on an exposed surface of the transparent conductive electrode stack; and
   forming a layer of a cathode material on an exposed surface of the layer of electroluminescent material.

9. An electronic device comprising:
   a transparent electrode stack of a layer of a carbon-containing material, and a layer of a work function modifying material located on an exposed surface of the layer of the carbon-containing material, wherein said layer of work function modifying material is a metal film or an array of metal dots, and said metal film or said array of metal dots are located beneath the layer of carbon-containing material.

10. The electronic device of claim 9, wherein said layer of carbon-containing material comprises a layer of graphene.

11. The electronic device of claim 9, wherein said layer of carbon-containing material comprises a carbon nanotube film.

12. The electronic device of claim 9, wherein said array of metal dots consists of a metal selected from Groups IIIB, IVB, VB, VIB, VIIB, VIIB, VIII or IIIA of the Periodic Table of Elements.

13. The electronic device of claim 9, wherein metal film is a metal oxide including a metal selected from Groups IIIB, IVB, VB, VIB, VIIB, VIIB, VIII or IIIA of the Periodic Table of Elements.

14. The electronic device of claim 9, further comprising:
   a layer of electroluminescent material located above the transparent conductive electrode stack; and
   a layer of a cathode material located on an exposed surface of the layer of electroluminescent material.

* * * * *